US012702035B2

(12) United States Patent
Spurney et al.

(10) Patent No.: US 12,702,035 B2
(45) Date of Patent: Aug. 4, 2026

(54) CHIP PACKAGE WITH EMBEDDED AND SHIELDED INDUCTORS

(71) Applicant: Advanced Micro Devices, Inc., Santa Clara, CA (US)

(72) Inventors: Robert Grant Spurney, Austin, TX (US); Sri Ranga Sai Boyapati, Austin, TX (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 359 days.

(21) Appl. No.: 18/369,969

(22) Filed: Sep. 19, 2023

(65) Prior Publication Data

US 2025/0096089 A1     Mar. 20, 2025

(51) Int. Cl.
| | |
|---|---|
| *H10W 70/685* | (2026.01) |
| *H05K 1/11* | (2006.01) |
| *H05K 1/16* | (2006.01) |
| *H05K 3/46* | (2006.01) |
| *H10D 1/20* | (2025.01) |
| *H10W 44/00* | (2026.01) |

(52) U.S. Cl.
CPC .......... *H10W 70/685* (2026.01); *H05K 1/112* (2013.01); *H05K 1/165* (2013.01); *H05K 3/4644* (2013.01); *H10D 1/20* (2025.01); *H10W 44/501* (2026.01); *H05K 2201/0707* (2013.01); *H05K 2201/086* (2013.01)

(58) Field of Classification Search
CPC ..... H05K 2201/0707; H05K 2201/086; H05K 3/4644; H05K 1/112; H05K 1/165; H10D 1/20; H01L 23/49822; H01L 23/49827; H01L 23/645
See application file for complete search history.

(56) References Cited

U.S. PATENT DOCUMENTS

| | | | | |
|---|---|---|---|---|
| 9,646,759 | B1 * | 5/2017 | Zhang | ................. H01F 17/0006 |
| 2015/0302974 | A1 * | 10/2015 | Zhao | .................... H01F 17/0013 |
| | | | | 336/200 |

(Continued)

OTHER PUBLICATIONS

U.S. Appl. No. 19/065,838, filed Feb. 27, 2025 Entitled "Structure and Method for Embedding a Plurality of Devices and Components Into a Thick Substrate Core".

(Continued)

*Primary Examiner* — Vongsavanh Sengdara
(74) *Attorney, Agent, or Firm* — Patterson + Sheridan, LLP

(57) ABSTRACT

Disclosed herein are a package substrate, a chip package, and method for fabricating the same. The package substrate includes a package core comprising vias; a plurality of build-up layers disposed on an upper surface of the package core, the plurality of build-up layers comprising metal traces connected with the vias; and a magnetic core inductor disposed in a cavity of the package core. The magnetic core inductor includes a magnetic inlay, and a first metal layer disposed in the cavity on the magnetic inlay below the plurality of build-up layers. A second metal layer may be further disposed between the first metal layer and the metal traces. Both the first and second metal layers may be floating or grounded. The first and second metal layers are configured to shield other electronic components from being interfered by the magnetic field generated by the magnetic core inductor.

20 Claims, 5 Drawing Sheets

(56) References Cited

U.S. PATENT DOCUMENTS

| | | | |
|---|---|---|---|
| 2016/0233153 A1* | 8/2016 | Kidwell, Jr. | H01F 17/0033 |
| 2020/0098621 A1* | 3/2020 | Bharath | H10W 20/093 |
| 2023/0088928 A1* | 3/2023 | Han | H10D 1/20 |
| | | | 257/773 |
| 2024/0071958 A1 | 2/2024 | Shi et al. | |
| 2024/0178087 A1 | 5/2024 | Weng et al. | |
| 2024/0234304 A1 | 7/2024 | Kulkarni et al. | |
| 2025/0079328 A1 | 3/2025 | Kulkarni et al. | |

OTHER PUBLICATIONS

U.S. Appl. No. 18/619,090, filed Mar. 27, 2024 Entitled "Integrated Circuit Package Device With a Power Delivery Substrate".

* cited by examiner

CHIP PACKAGE WITH EMBEDDED AND SHIELDED INDUCTORS

TECHNICAL FIELD

Embodiments of the present invention generally relate to a chip package having embedded magnetic inductors that are shielded with a plated metal layer, and in particular, to a chip package that has one or more metal layers directly plated on a magnetic inlay embedded in a package substrate.

BACKGROUND

Inductors and transformer are often used in chip packages for power regulation. As dimensions shrink and power demands increase, the area available for inductors continues to diminish. As a result, more and more chip packages start using magnetic core inductors ("MCI") that are embedded into substrate cores in a chip package. These MCIs can provide high inductance in small form factor for improved power delivery. But, they also introduce parasitic inductance, crosstalk, and loss to power and data lines in close proximity due to the magnetic field generated by these MCIs. This kind of interference is particularly problematic when those data lines are used for high-speed signal routing, such as serializer/deserializer ("SERDES") channels. The switching of the magnetic field generated by MCI can cause loss and long signal delay of SERDES channels.

Therefore, a need exists to have an improved magnetic core inductor.

SUMMARY

Disclosed herein are a package substrate, a chip package, and method for fabricating the same. The package substrate includes a package core comprising vias; a plurality of build-up layers disposed on an upper and/or lower surfaces of the package core, the plurality of build-up layers comprising metal traces connected with the vias; and a magnetic core inductor disposed in a cavity of the package core. The magnetic core inductor includes a magnetic inlay; and a first metal layer disposed in the cavity on the surfaces of the magnetic inlay below the plurality of build-up layers. A second metal layer may be further disposed between the first metal layer and the metal traces. Both the first and second metal layers may be floating or grounded. The first and second metal layers are configured to shield other electronic components from being interfered by the magnetic field generated by the magnetic core inductor.

In one example, a chip package is provided that includes an integrated circuit (IC) die having functional circuitry; and a package substrate. The package substrate includes a package core comprising vias; a plurality of build-up layers disposed on surfaces above and/or below the package core, the plurality of build-up layers comprising metal traces connected with the vias; and a magnetic core inductor disposed in a cavity of the package core. The magnetic core inductor includes a magnetic inlay; and a first metal layer disposed in the cavity on the surfaces of the magnetic inlay below the plurality of build-up layers. A second metal layer may be further disposed between the first metal layer and the metal traces. Both the first and second metal layers may be floating or grounded. The first and second metal layers are configured to shield other electronic components from being interfered by the magnetic field generated by the magnetic core inductor.

In another example, a method for embedding a magnetic core inductor in a package substrate is provided. The method includes the following operations: generating a cavity in a core of the package substrate; attaching a base substrate to a first side of the core; plating a conductive material onto a magnetic inlay; forming a conductive path in the magnetic inlay; disposing the magnetic inlay inside the cavity; binding the core and the magnetic inlay with a dielectric material; forming, with the dielectric material, a second binding layer at a second side of the core that is opposite to the first side; and removing the base substrate. The method may further include forming a first binding layer at the first side of the core.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements of one embodiment may be beneficially incorporated in other embodiments.

DETAILED DESCRIPTION

A chip package and method for fabricating the same are provided that have a magnetic inductor covered by a metal layer embedded within a core of a package substrate of the chip package. The metal layer shields other electronic components built in the package substrate, such as a power line or a data line, from magnetic field generated by the magnetic inductor. A second metal layer may be optionally disposed between the magnetic inductor and other electronic components to further reduce the interference. The second metal layer may be disposed outside of the package core. The metal layers for shielding the electronic components may be floating or grounded. These metal layers are capable of reduce the signal delay or loss in those electronic components, such as SERDES channels.

Figure 1:
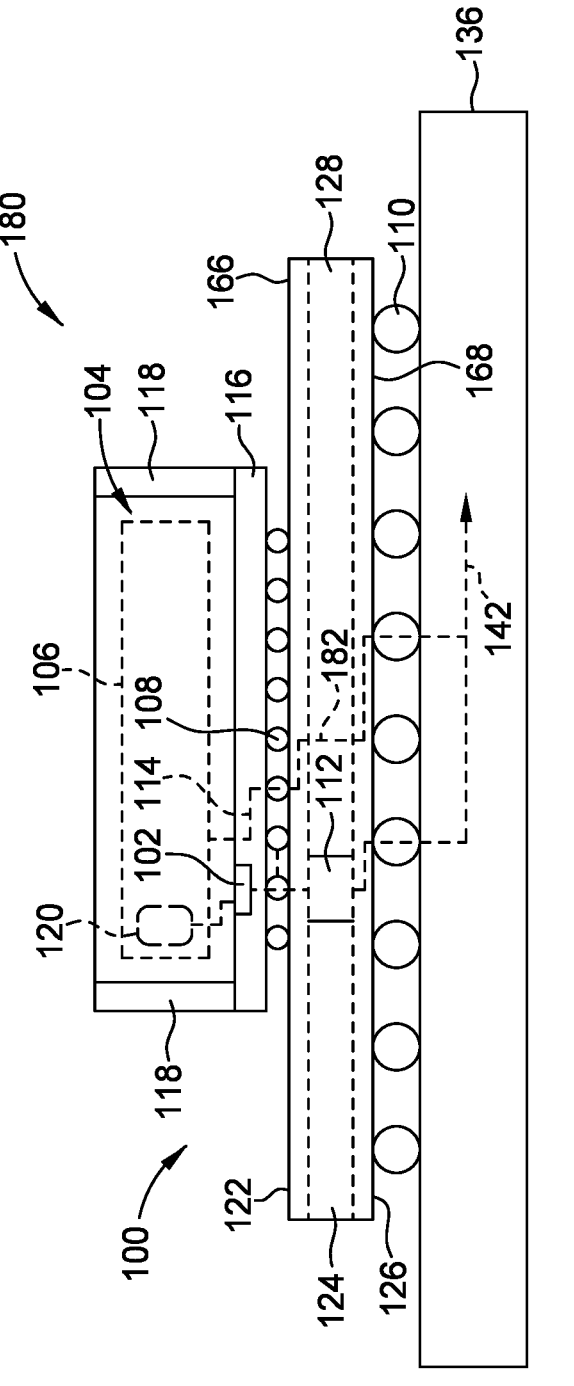
FIG. 1 is a schematic cross-sectional view of a chip package having a magnetic core inductor disposed in a core of a package substrate according to an embodiment.

Turning now to FIG. 1, a schematic sectional view of a chip package 100 is illustrated. The chip package 100 includes one or more integrated circuit (IC) die 104, an optional interposer 116, a package substrate 128, and a printed circuit board (PCB) 136. The IC die 104 is amounted on a top surface of the interposer 116. A plurality of IC dies 104 may be mounted on the top surface of the interposer 116, which provides interconnections among the plurality of IC dies 104. According to an embodiment, the plurality of IC dies 104 may be stacked and then mounted on the surface of the interposer 116. The opposite side of the interposer 116 is coupled to the package substrate 128 via a plurality of interconnects 108. The package substrate 128 may be mounted on PCB 136 via a plurality of solder balls 110 to form an electronic device 180, such as tablets, computers, smart phones, control systems, data centers, and artificial intelligence system. In embodiments where an interposer is not utilized, the IC dies 104 are mounted on the top surface of the package substrate 128 such that the functional circuitry of the IC dies 104 are connected with the circuitry of the package substrate 128.

According to an embodiment, the package substrate 128 includes an embedded voltage regulation circuitry 112 that is configured to regulate power to a functional circuitry 106 of the IC die 104. The embedded voltage regulation circuitry 112 is coupled with the functional circuitry 106 via interconnects 108 disposed between the interposer 116 and the package substrate 128 and, optionally, another functional circuitry 102 disposed in the interposer 116. The functional circuitry 106 may optionally include another power management circuitry 120. The embedded voltage regulation circuitry 112 includes a shield magnetic core inductor as set forth in the present application. The functional circuitry 106 may include block random access memory (BRAM), Ultra-RAM (URAM), digital signal processing (DSP) blocks, configurable logic elements (CLEs), and the like. The IC die 104 may include programmable logic devices, such as field programmable gate arrays (FPGA), memory devices, such as high band-width memory (HBM), optical devices, processors or other IC logic structures. Although in FIG. 1 only a single voltage regulation circuitry 112 is shown, a plurality of such embedded voltage regulation circuitries may be embedded in the package substrate 128 and utilized as desired.

Optionally, the IC die 104 may be a plurality of IC dies 104 that may be disposed in a vertical stack and/or disposed laterally side by side. It is contemplated that the plurality of IC dies 104 may be the same or different types. Although only one IC die 104 is shown in FIG. 1, the number of IC dies 104 disposed in the chip package 100 may vary from one to as many as can fit within the chip package 100.

The interposer 116 is connected with contact pads at the bottom surface of the IC die 104. The interposer 116 includes conductive routing formed from a plurality of patterned metal layers disposed between a plurality of dielectric layers. The patterned metal layers are coupled by vias to form an interconnect circuitry 114 in the interposer 116. The interconnect circuitry 114 connects the functional circuitry 106 of the IC die 104 to interconnect circuitry 182 formed in the package substrate 128. A mold compound 118 surrounding the lateral sides of the IC die 104 may be utilized to provide structural support to the interposer 116.

The package substrate 128 generally includes upper build-up layers 122, a core 124, and lower build-up layers 126. The upper build-up layers 122 are disposed on the top surface of the core 124 and have a top surface 166. The lower build-up layers 126 are disposed on the bottom surface of the core 124 and have a bottom surface 168. The upper build-up layers 122 include a plurality of conductive routings and vias that are patterned to form a portion of the interconnect circuitry 182. The lower build-up layers 126 may be configured similar to the upper build-up layers 122 and include metal and dielectric layers patterned to form another portion of the interconnect circuitry 182. One end of the interconnect circuitry 182 terminates at the bond pad formed on the top surface 166 of the package substrate 128 where the interconnect circuitry 182 connects to the interconnect circuitry 114 of the interposer 116. The other end of the interconnect circuitry 182 formed in the bond pad formed on the lower surface 168 of the package substrate 128 where the interconnect circuitry 182 connects to the PCB 136 via the solder balls 110.

The PCB 136 includes another interconnect circuitry 142 configured to transmit power and data to and from an external source. The interconnect circuitry 142 of the PCB 136 are connected with the interconnect circuitry 182 and the voltage regulation circuitry 112 via a plurality of solder balls 110.

Figure 2:
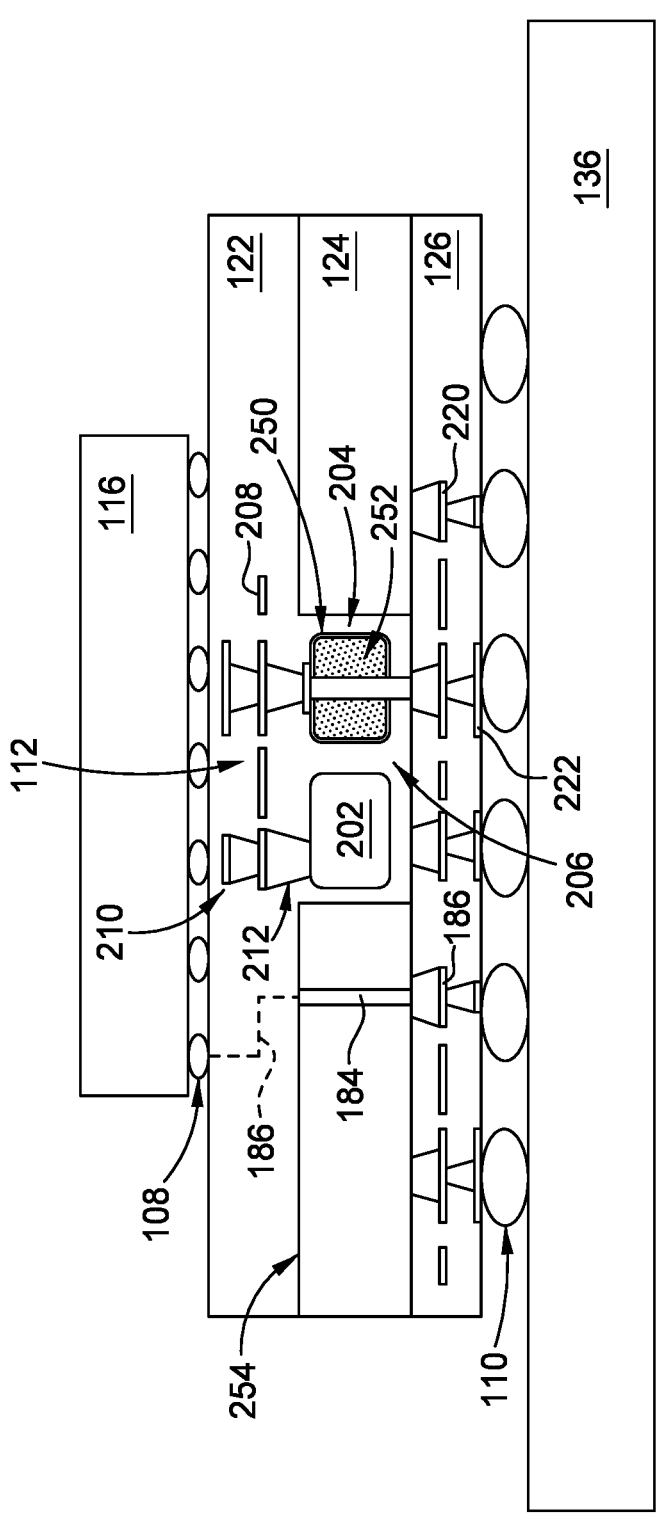
FIG. 2 is a schematic cross-sectional view of an embedded voltage regulator disposed in a package substrate according to an embodiment.

FIG. 2 illustrates, in detail, a schematic cross-sectional view of a package substrate 128 having an embedded voltage regulation circuitry 112, according to an embodiment. The embedded voltage regulation circuitry 112 includes a regulation circuitry 202 coupled with a magnetic core inductor 204. The regulation circuitry 202 may include a chip having power control functions. The magnetic core inductor 204 may include a magnetic inlay with patterned conductive lines looping around the magnetic inlay or directly through the magnetic inlay. The regulation circuitry 202 is configured to control the electric current flowing through the conductive lines of the magnetic core inductor 204.

As shown in FIG. 2, the regulation circuitry 202 and the magnetic core inductor 204 are disposed in a cavity 206 formed in the core 124. The regulation circuit 202 is coupled to the interposer 116 by a plurality of vias 212 and metal layers 208 and 210 disposed in the upper build-up layer 122. The regulation circuit 202 is coupled to the PCB 138 by another plurality of vias and metal layers disposed in the lower build-up layer 126. Similarly, the magnetic core inductor 204 can also be connected to the PCB 136 and the interposer 116 by the vias and metal layers in the upper and lower build-up layers. According to an embodiment, the magnetic core inductor 204 is connected to the regulation circuit 202 by vias and metal traces 186 in the lower build-up layer 126.

Spaces in the upper build-up layer 122 and the lower build-up layer 126 that are not occupied by the vias and metal traces are filled with dielectric materials. According to an embodiment, the upper and lower build-up layer 122 may include other metal traces 186 for other functions, such as power and data transmission. The core 124 may also include vias 184 coupled with the metal traces 186. In one implementation, the metal traces 186 and metal layers 208, 210 are used for high speed data transfer, such as SERDES channels.

According to an embodiment, the magnetic core inductor 204 includes a metal layer 250 enclosing the magnetic core inductor 204. The metal layer 250 is configured to shield other electronic components from the interference generated by the magnetic core inductor 204. The metal layer 250 may be a single layer, such as a nickel layer or a copper layer, a bi-layer, such as a nickel-copper bi-layer, or a laminate comprised of multiple metal layers. The metal layer 250 is electrically isolated from the metal layers 208, 210, 220, and 222 of the build-up layer. The metal layer 250 is disposed between the metal layers 208, 210, 220, and 222 in the build-up layers and the magnetic core inductor 204. In an example, the metal layer 250 is plated directed to the magnetic inlay 252 of the magnetic core inductor 204. The metal layer 250 is disposed within the cavity 206 and below an upper surface 254 of the core 124 such that it does not hinder any subsequent process used to make the build-up layers 122 and 126. The metal layer 250 may be floating or grounded.

According to an embodiment, the regulation circuitry 202 and the magnetic core inductor 204 are disposed side by side in the cavity 206. According to another embodiment, the regulation circuitry 202 and the magnetic core inductor 204 are each disposed in their respective cavities.

Figure 3:
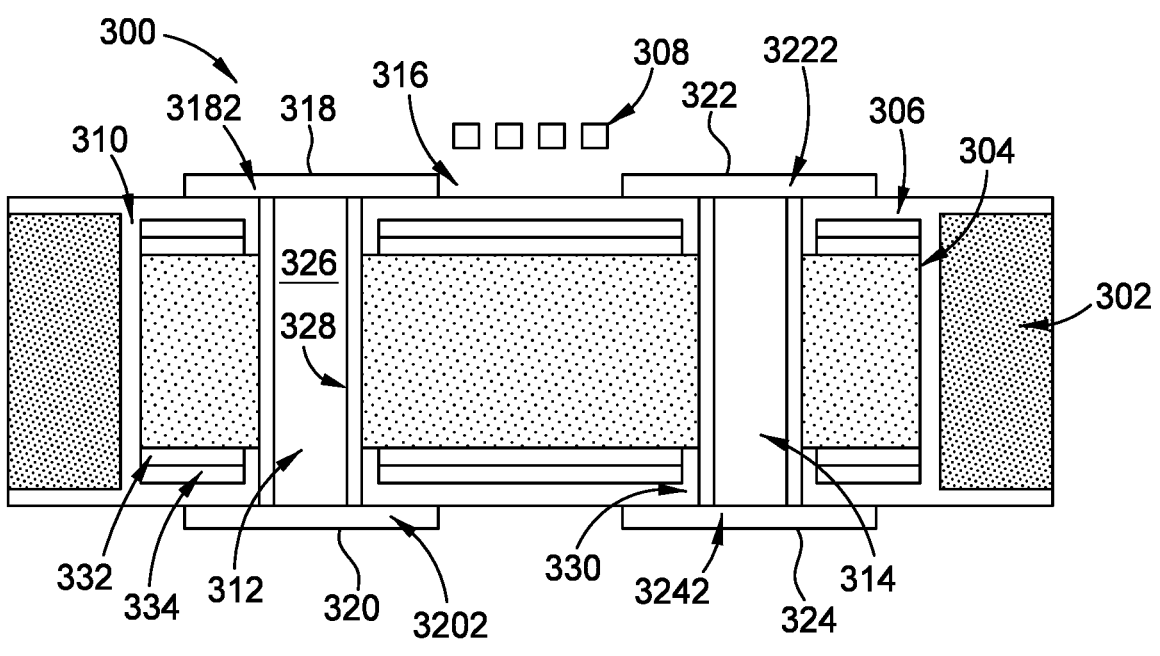
FIG. 3 is a schematic cross-sectional view of an embedded magnetic core inductor with plated metal layers according to an embodiment.

FIG. 3 illustrates a cross-sectional view of a magnetic core inductor 300 according to an embodiment. The magnetic core inductor 300 includes a magnetic inlay 304, a metal layer 306 enclosing the magnetic inlay 304, and a plurality of vias 312 and 314 formed by filing plug-through holes with conductive materials. A package core 302 includes a cavity 316 that contains the magnetic inlay 304 and the metal layer 306. According to an embodiment, a metal layer 306 is plated directly to the magnetic inlay 304, for example by an electroless plating process. Alternatively, the metal layer 306 may be a metal foil adhered to the magnetic inlay 304. The metal layer 306 may be single or have multiple layers. In the examiner illustrated in FIG. 3, the metal layer 306 includes a first metal layer 334 of copper and a second metal layer 332 of nickel. The nickel layer is disposed between the copper layer and the magnetic inlay. The nickel layer is capable of acting as a diffusion or corrosion barrier. Other suitable materials may also be used for the first metal layer 334 and the second metal layer 332. The metal layer 306 is disposed within the cavity and below metal traces 308 formed in the upper build-up layers 122 of the package substrate 128. The metal traces 308 are generally used to transmit data signals. The metal layer 306 substantially covers all surfaces of the magnetic inlay 304.

The plurality of vias 312 and 314 form a portion of the conductive path that forms a coil through and/or around the magnetic inlay 304. The plurality of vias 312 and 314 include first ends 318, 322 and second ends 320, 324. The ends 318, 320, 322, and 324 have contact pads 3182, 3202, 3222, 3242 formed by metal layers that have larger diameters than the plug-through holes filled with a bulk metal 326. The vias 312 and 314 further include a seed layer 328 and a bulk conductive material 326. The seed layer 328 may be nickel and the conductive material 326 may be copper. The first via 312, the second via 314, the first ends 318 and 322, and the second ends 320 and 324 are connected in way to conduct through the magnetic inlay 304 such that when electric currents go through the coil, a strong magnetic field is generated.

According to an embodiment, the metal layer 306 is disposed between the first ends 318, 322 and the second ends 320, 324. As shown in FIG. 3, the metal layer 306 extends underneath the first ends 318, 322 and/or the second ends 320, 324. A gap 330 is defined between the metal layer 306 and the seed layer 328 of the vias 312 and 314 such that the metal layer 306 is isolated from the current flow looping around the magnetic inlay 304. According to an embodiment, the metal traces 308 are used for high-speed data channels, such as SERDES, for example.

Figure 4:
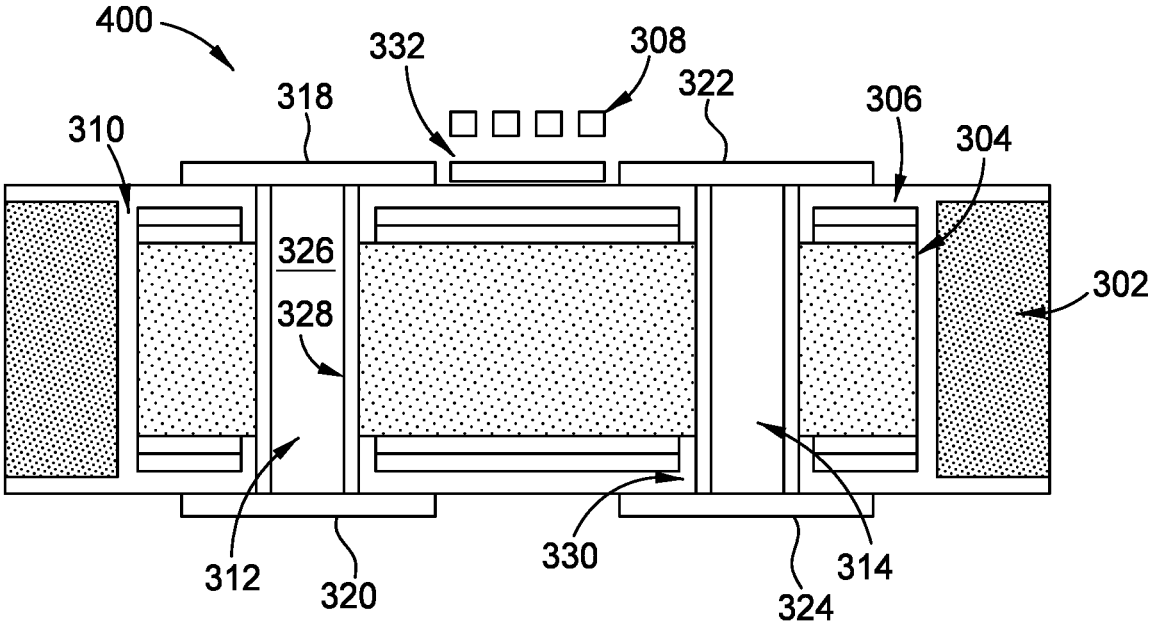
FIG. 4 is a schematic cross-sectional view of an embedded magnetic core inductor with plated metal layers according to an embodiment.

FIG. 4 illustrates a cross-sectional view of a magnetic core inductor 400 according to an embodiment. Compared with the magnetic core inductor 300 of FIG. 3, the magnetic core inductor 400 of FIG. 4 further includes another metal layer 332 disposed between the metal layer 306 and the metal traces 308 used as SERDES channels. The metal layer 332 is configured to act as another shield between the magnetic inlay 304 and the metal traces 308. According to an embodiment, the mental layer 332 substantially covers any open surface in close proximity to the metal traces 308 to further reduce the magnetic inference generated by the magnetic core inductor 400. As shown in FIG. 4, the metal layer 332 is disposed outside the cavity of the core 302 and is formed by using the same metal layer as those of the first end 318 and the second end 322. The metal layer 332 may be floating or grounded.

Figure 5:
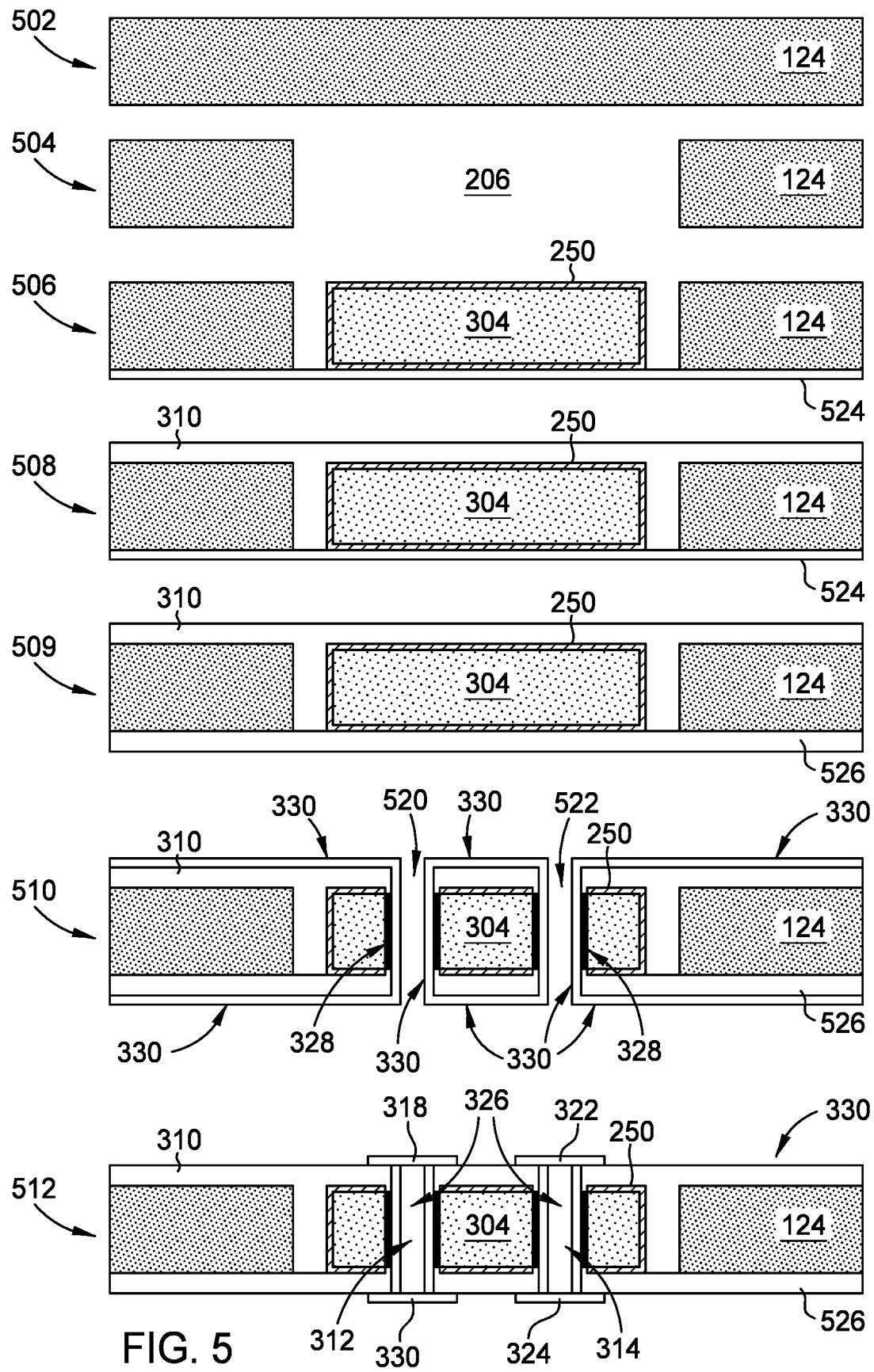
FIG. 5 is a schematic process for embedding the magnetic core inductor in a package substrate according to an embodiment.

FIG. 5 illustrates a schematic process for embedding the magnetic core inductor in a package substrate according to an embodiment. At operation 502, the process starts with a core 124. The core 124 provides rigidity to support the build-up layers and provides holes for vias, either blind or through vias or both. The core 124 may be a composite material formed by a polymer matrix loaded with fillers and resin.

At operation 504, a cavity 206 is created in the core 124. The cavity 206 may be created by milling, mechanical or laser drilling, etching, or other suitable technique. At operation 506, a magnetic inlay is disposed in the cavity 206. The magnetic inlay 304 includes a block of magnetic material plated with metal layers 250. In one example, the metal layer 250 includes a nickel layer and a copper layer. The nickel and copper layers may be formed by electroless plating. The magnetic inlay 304 is sized to be slightly smaller than the cavity 206 such that gaps are formed between the core 124 and the magnetic inlay 304. A base substrate 524, such as a tape film, may be used to support and keep the core 124 and the magnetic inlay 304 in place.

At operation 508, a dielectric material fills the gaps between the magnetic inlay 304 and the cavity and covers the top surface of the core 124. The dielectric material forms a binding layer 310 that is configured to bind the core 124 and the magnetic inlay 304 together. The binding layer 310 is also capable of binding the build-up layers. In an example, the binding layer 310 may include epoxy or other suitable potting material or adhesive.

At operation 509, the base substrate 524 is removed. Another layer of dielectric material 526 is deposited at a bottom surface of the core 124 opposite to the binding layer 310 to protect the core 124 and the magnetic inlay 304.

At operation 510, through holes 520 and 522 are formed. The through holes 520 and 522 may be created by mechanical or laser drilling, or other suitable technique. The through holes 520 extend through the dielectric layers 310, 526 and the magnetic inlay 304 and provide space that is filed with the vias 312 and 314. In addition, through holes may be created in the core 124. A seed layer 328, such as nickel, is subsequently plated within the plug-through holes 520 and 522 selectively on the exposed magnetic material of the magnetic core 304. After the seed layer 328 is plated, another seed layer 330, such as copper, may be plated on all exposed surfaces of the core 124.

At operation 512, dielectric materials 326 are deposited in the through holes 520 and 522 and form the vias 312 and 314. Subsequently, another metal layer is plated on the seed layer 330 and patterned according to the locations of the vias 312 and 314 to form the ends 318, 320, 322, and 324. The second metal layer 332 as shown in FIG. 4 can also be deposited during operation 512. After the material 326 are deposited in the through holes 520 and 522, polishing may be applied to the binding layer 310 and the conductive material 326 to create a flat surface for the creation of the ends 318-324 and the second metal layer 332 by a suitable method, such as a plating method.

After operation 512, upper build-up layers 122 may be subsequently deposited on the top surface of the binding layer 310 with known processes. Additional build-up layers may also be deposited on the bottom surface of the binding layer 526.

Figure 6:
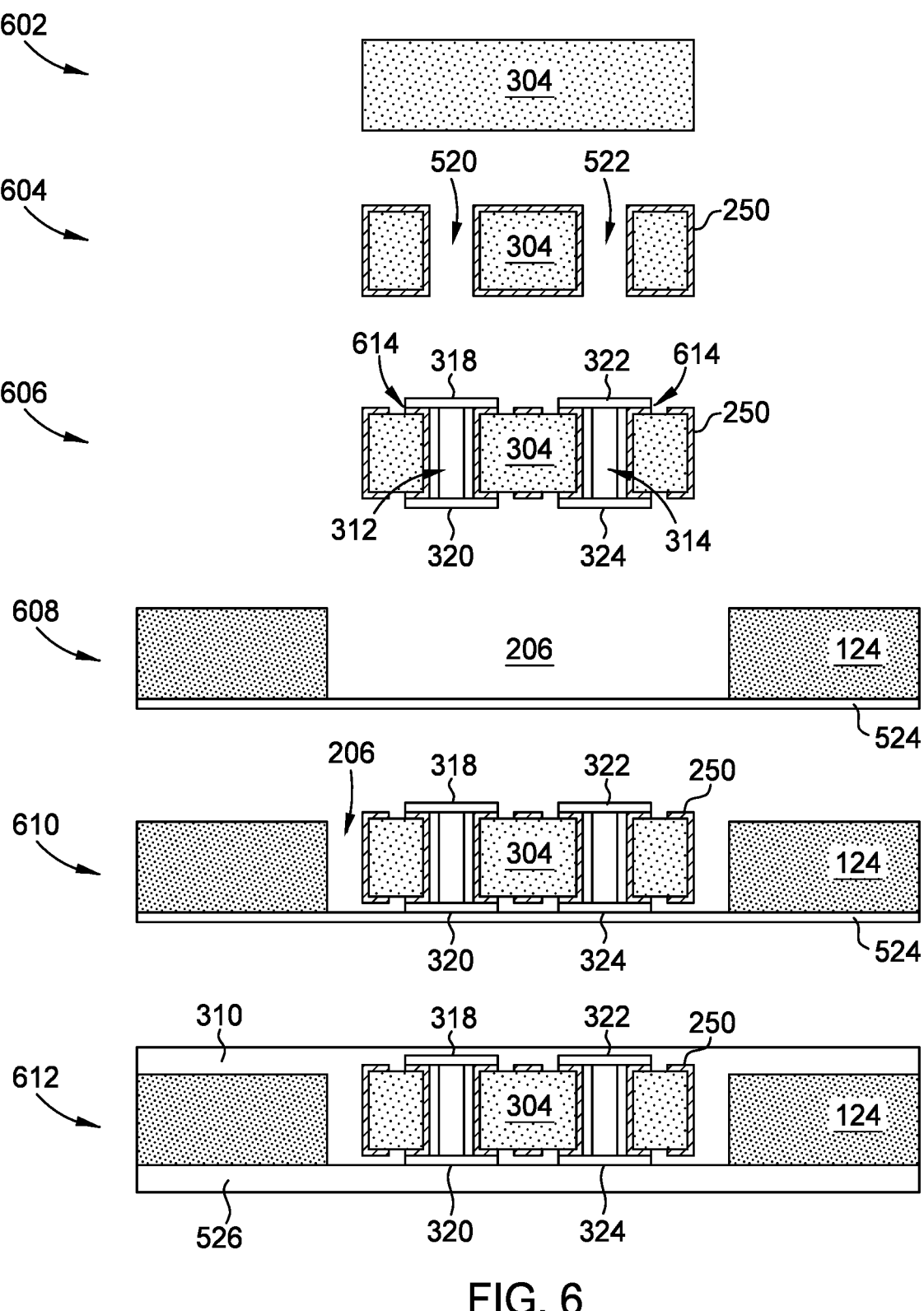
FIG. 6 is a schematic process for embedding the magnetic core inductor in a package substrate according to an embodiment.

FIG. 6 illustrates a schematic process for embedding the magnetic core inductor in a package substrate according to an embodiment. In FIG. 5, the vias 312 and 314 are formed after the magnetic inlay 304 is disposed within the cavity of the core 124. In comparison, operations in FIG. 6 have the vias 312 and 314 formed in the magnetic inlay 304 before they are disposed within the cavity of the core 124. At operation 602, a magnetic inlay 304 with a proper dimension is prepared. At operation 604, through holes 520 and 522 are formed in the magnetic inlay 304. Then, a metal layer 250, which may include a nickel layer and a copper layer, are plated over the surfaces of the magnetic inlay 304, including the through holes 520 and 522. The nickel and copper layers may be formed by electroless plating. Then, the through holes 520 and 522 are filled with dielectric materials.

At operation 606, additional metal layers are plated on the magnetic inlay 304 and patterned to form completed vias 312 and 324. The ends 318, 322, 320, and 324 are also formed. In addition, cutout areas 614 in the metal layer 250 at areas surrounding the ends 318, 320, 322, and 324 are formed to create an open circuit between the vias 312 and 314 and the metal layer 250.

At operation 608, a cavity 206 is created in the core 124 by milling, mechanical or laser drilling, etching, or other suitable technique. Then, a base substrate 524 is attached to the core 124.

At operation 610, the magnetic inlay 304 is placed inside the cavity 206. At operation 612, a binding layer 310 is deposited on a top surface of the core 124. Then, the base substrate 524 is removed. An optional bottom binding layer 526 may be further formed on a bottom surface of the core 124. Once the binding layers 310 and 526 are formed, additional build-up layers may be subsequently processed.

While the foregoing is directed to embodiments of the present invention, other and further embodiments of the invention may be devised without departing from the basic scope thereof, and the scope thereof is determined by the claims that follow.

What is claimed is:

1. A package substrate of a chip package, comprising a package core comprising vias;
   a plurality of build-up layers disposed on an upper surface of the package core, the plurality of build-up layers comprising metal traces connected with the vias; and
   a magnetic core inductor disposed in a cavity of the package core, the magnetic core inductor comprising:
      a magnetic inlay; and
      a first metal layer disposed in the cavity on the magnetic inlay below the plurality of build-up layers, wherein the first metal layer is a conductive shielding layer electrically isolated from conductive paths of the magnetic core inductor by a gap between the first metal layer and the conductive paths.

2. The package substrate according to claim 1, wherein the first metal layer is electrically floating and disposed between the metal traces and the magnetic inlay.

3. The package substrate according to claim 2, wherein the first metal layer comprises a nickel layer and a copper layer.

4. The package substrate according to claim 1, wherein the magnetic inlay comprises a plurality of plug-through holes filled with conductive material.

5. The package substrate according to claim 4, wherein each plug-through hole comprises a first end and a second end, the first and second ends having contact pads; and the first metal layer extends underneath the contact pads of the first end and the second end.

6. The package substrate according to claim 5, wherein the magnetic core inductor further comprises a gap between the first metal layer and the conductive material of the plurality of plug-through holes.

7. The package substrate according to claim 4, further comprising a second metal layer disposed between the magnetic inlay and the metal traces.

8. The package substrate according to claim 7, wherein the second metal layer is electrically floating and disposed between the first metal layer and the metal traces.

9. The package substrate according to claim 8, wherein the second metal layer is disposed outside of the package core.

10. A chip package comprising:
   an integrated circuit (IC) die having functional circuitry; and
   a package substrate coupled with the IC die and comprising:
      a package core comprising vias;
      a plurality of build-up layers disposed on an upper surface of the package core, the plurality of build-up layers comprising metal traces connected with the vias; and
      a magnetic core inductor disposed in a cavity of the package core and comprising:
         a magnetic inlay; and
         a first metal layer disposed in the cavity on the magnetic inlay below the plurality of build-up layers, wherein the first metal layer is a conductive shielding layer electrically isolated from conductive paths of the magnetic core inductor by a gap between the first metal layer and the conductive paths.

11. The chip package according to claim 10, wherein the first metal layer is electrically floating and disposed between the metal traces and the magnetic inlay.

12. The chip package according to claim 11, wherein the first metal layer comprises a nickel layer and a copper layer.

13. The chip package according to claim 10, wherein the magnetic inlay comprises a plurality of plug-through holes filled with conductive material.

14. The chip package according to claim 13, wherein each plug-through hole comprises a first end and a second end, the first and second ends having contact pads; and the first metal layer extends underneath the contact pads of the first end and the second end.

15. The chip package according to claim 14, wherein the magnetic core inductor further comprises a gap between the first metal layer and the conductive material of the plurality of plug-through holes.

16. The chip package according to claim 13, further comprising a second metal layer disposed between the magnetic inlay and the metal traces.

17. The chip package according to claim 16, wherein the second metal layer is electrically floating and disposed between the first metal layer and the metal traces.

18. The chip package according to claim 17, wherein the second metal layer is outside of the package core.

19. A method of embedding a magnetic core inductor in a package substrate, the method comprising:

generating a cavity in a core of the package substrate;

attaching a base substrate to a first side of the core;

plating a conductive material onto a magnetic inlay;

forming a conductive path in the magnetic inlay;

disposing the magnetic inlay inside the cavity;

binding the core and the magnetic inlay with a dielectric material;

forming, with the dielectric material, a second binding layer at a second side of the core that is opposite to the first side; and removing the base substrate.

20. The method of claim 19, further comprising:

forming a first binding layer at the first side of the core.

*   *   *   *   *